United States Patent [19]
Patel et al.

[11] Patent Number: 5,856,061
[45] Date of Patent: Jan. 5, 1999

[54] PRODUCTION OF COLOR PROOFS AND PRINTING PLATES

[75] Inventors: Ranjan C. Patel, Little Hallingbury, England; John Souter, Orono, Minn.

[73] Assignee: Minnesota Mining and Manufacturing Company, St. Paul, Minn.

[21] Appl. No.: 911,555

[22] Filed: Aug. 14, 1997

[51] Int. Cl.⁶ .............................. G03F 7/038; G03F 7/34; G03F 7/36
[52] U.S. Cl. .......................... 430/201; 430/200; 430/293; 430/952; 430/964
[58] Field of Search .................................. 430/200, 201, 430/293, 964, 952

[56] References Cited

U.S. PATENT DOCUMENTS

| | | | |
|---|---|---|---|
| 3,964,389 | 6/1976 | Peterson | 430/201 |
| 4,876,235 | 10/1989 | DeBoer | 430/201 |
| 4,950,639 | 8/1990 | DeBoer et al. | 430/201 |
| 5,126,760 | 6/1992 | DeBoer | 346/108 |
| 5,156,938 | 10/1992 | Foley et al. | 430/200 |
| 5,171,650 | 12/1992 | Ellis et al. | 430/201 |
| 5,238,778 | 8/1993 | Hirai et al. | 430/200 |
| 5,340,699 | 8/1994 | Haley et al. | 430/302 |
| 5,352,562 | 10/1994 | Takahashi et al. | 430/253 |
| 5,372,907 | 12/1994 | Haley et al. | 430/157 |
| 5,372,915 | 12/1994 | Haley et al. | 430/302 |
| 5,395,729 | 3/1995 | Reardon et al. | 430/200 |
| 5,401,606 | 3/1995 | Reardon et al. | 430/200 |
| 5,441,794 | 8/1995 | Hitomi et al. | 428/195 |
| 5,475,418 | 12/1995 | Patel et al. | 347/256 |
| 5,501,937 | 3/1996 | Matsumoto et al. | 430/200 |
| 5,518,861 | 5/1996 | Coveleskie et al. | 430/200 |
| 5,563,019 | 10/1996 | Blanchet-Fincher | 430/200 |
| 5,576,144 | 11/1996 | Pearce et al. | 430/200 |
| 5,576,268 | 11/1996 | Burberry et al. | 430/201 |
| 5,580,693 | 12/1996 | Nakajima et al. | 430/201 |
| 5,593,808 | 1/1997 | Ellis | 430/201 |
| 5,605,780 | 2/1997 | Burberry et al. | 430/278.1 |
| 5,633,113 | 5/1997 | Ellis | 430/201 |
| 5,633,118 | 5/1997 | Burberry et al. | 430/201 |
| 5,633,119 | 5/1997 | Burberry et al. | 430/201 |

FOREIGN PATENT DOCUMENTS

| | | |
|---|---|---|
| 0 160 395 | 11/1985 | European Pat. Off. . |
| 0 163 297 | 12/1985 | European Pat. Off. . |
| 0 467 106 A1 | 6/1991 | European Pat. Off. . |
| 0 542 544 A2 | 11/1992 | European Pat. Off. . |
| 0 602 893 A1 | 6/1994 | European Pat. Off. . |
| 0 675 003 A1 | 10/1995 | European Pat. Off. . |
| 0 679 531 A1 | 11/1995 | European Pat. Off. . |
| 0 382 420 B1 | 6/1996 | European Pat. Off. . |
| 0 722 828 A2 | 7/1996 | European Pat. Off. . |
| 0 696 245B1 | 10/1996 | European Pat. Off. . |
| 0 745 490 A2 | 12/1996 | European Pat. Off. . |
| 0 751 008 A1 | 1/1997 | European Pat. Off. . |
| 0 755 802 A1 | 1/1997 | European Pat. Off. . |
| 0 756 942 A1 | 2/1997 | European Pat. Off. . |
| 4140191 | of 0000 | Japan . |
| 4201485 | of 0000 | Japan . |
| 51088016 | of 0000 | Japan . |
| 63319191 | of 0000 | Japan . |
| 63319192 | of 0000 | Japan . |
| WO 90/12342 | 10/1990 | WIPO . |
| WO 95/05623 | 2/1995 | WIPO . |
| WO 96/34767 | 11/1996 | WIPO . |

*Primary Examiner*—Richard L. Schilling

[57] ABSTRACT

A color reproduction method is described using laser addressable thermal transfer donor elements which may be used to image both color proofing films and printing plates. Matched proofs and plates may be generated by direct digital address since identical transfer media are used in the respective imaging processes. In addition, each plate bears a resin image of a color that matches the color of the ink that will be used with that plate thus providing a convenient means of identification. In other words, the identity of each plate (i.e. whether it bears the y, m, c or k separation image) is immediately apparent by visual inspection, thus removing any risk of confusion and any need to provide individual plates with identification marks.

16 Claims, No Drawings

5,856,061

PRODUCTION OF COLOR PROOFS AND PRINTING PLATES

FIELD OF THE INVENTION

This invention relates to the production of color proofs and printing plates and in particular to their production using laser thermal colorant transfer in which identical transfer donor media are used for the production of printing plate and color proof.

BACKGROUND

In the graphic arts industry, the use of laser scanners in the reproduction of color images is known. By means of the scanner, it is possible to separate an original color image (such as a photograph, a painting, etc.) into its yellow (y), magenta (m), cyan (c) and (optionally) black (k) components (i.e., its color separation images), and to store these as separate computer data files. By recombining these color separation images in a suitable output medium, a reproduction of the original color image is obtained. To an increasing extent, original color images are generated on computers in the first place, but these also take the form of digital data files representing color separation images which ultimately must be combined in a suitable output medium.

If large numbers of copies of the image are required, it is necessary to generate a separate printing plate corresponding to each of the separation images and use them to print, in exact superposition, the separate y, m, c, k separation images using inks of the appropriate colors. The process can be performed repetitively at high speed to produce many thousands of copies. Before starting such an expensive process, however, it is customary to output the separation images in the form of a color proof which is a one-off color hardcopy that predicts, as accurately as possible, the appearance of the final printed image.

There are two distinct methods by which digitally-stored color separation images may be output as plates or proofs, namely "direct" and "indirect" methods.

The indirect method is the well-established technique whereby each of the stored color separation image files is output by laser scanning on to a separate black and white silver halide film which is developed and fixed in the normal manner. Each of the resulting black and white images is then used as a mask for the contact exposure of a plate or a single-color component of a photomechanical proof. Because both the plate and the proof are exposed through the same mask, and typically involve similar imaging chemistry (e.g. a photoresist), the proof provides an accurate simulation of the image that will ultimately be printed by the plate. The disadvantage of this method lies in the cost and inconvenience of using the intermediate films.

It has been recognized that "direct" laser exposure of plates and proofing materials represents a more cost-effective use of the technology and there are various disclosures of printing plates imageable by lasers. These embrace modifications to conventional plate coatings to enable laser address, as in the various photopolymer plates sensitised to Argon ion lasers and the adaptation of phenolic resin based plate coatings to infrared laser address, as disclosed in U.S. Pat. Nos. 5,340,699; 5,372,907; and 5,372,915, as well as "unconventional" imaging methods, such as laser thermal transfer.

In the laser thermal transfer method, a donor sheet comprising a layer of an infrared absorbing transfer medium is placed in contact with a receptor, and the assembly is exposed to a pattern of infrared (IR) radiation, normally from a scanning laser source. Absorption of the IR radiation causes a rapid build-up of heat in the exposed areas which in turn causes transfer of the medium from the donor to the receptor in those areas. Laser thermal transfer technology may be adapted for the production of lithographic printing plates by using a receptor having a hydrophilic surface (such as anodised aluminium foil) and transferring thereto a resinous, oleophilic material. Such systems are disclosed, for example, in U.S. Pat. Nos. 5,401,606; 5,395,729; and 5,171,650; European Patent Application Nos. 0160396; and 0160395; and Japanese Publication No.04-140191. With a view to increasing the run-length of the resulting plates, the resinous oleophilic material is frequently designed to be crosslinkable, e.g. by heat treatment, and/or UV-irradiation, so as to enable the transferred image to be hardened in a separate post-transfer step. Such systems are disclosed, for example, in U.S. Pat. No. 5,395,729; EP Application Nos. 0160396; and 0160395. The crosslinking mechanisms disclosed include photocuring of unsaturated monomers and standard thermosetting processes, such as, the thermal curing of epoxy resins, phenol-formaldehyde resins, melamine-formaldehyde resins, etc.

Laser thermal transfer technology is also readily adaptable to the generation of color proofs. For this purpose, the transfer medium must comprise one or more dyes or pigments matching the color of one of the inks to be used in the printing process. The receptor is typically white paper or card, optionally bearing a colorless resin coating. All the separation images may be output in this fashion to a common receptor to provide a full color proof. Such systems are disclosed, for example, in U.S. Pat. Nos. 5,171,650; and 5,126,760; WO Application No. 90/12342, Japanese Publications Nos. 63-319192; and 04-201485; and European Application Nos. 0542544; and 0602893.

Laser thermal transfer is potentially a highly attractive means for generating both proofs and plates directly from digitally-stored image data, since the use of photosensitive materials and wet processing is not required. However, matched proofing and platemaking media, imageable by the same or similar laser sources to provide well-matched proofs and plates, have not so far been described in the patent literature or made available commercially. Although certain patents, such as, U.S. Pat. Nos. 5,395,729; and 5,171,650; and WO Application No. 90/12342 disclose the generation of both proofs and plates by laser thermal transfer, there is no suggestion that identical donor media might be used for both purposes, or that any advantage would be gained from doing so. Indeed the examples in these patents invariably disclose the use of different donor media formulations for the respective imaging applications.

The state of the art teaches that different (and mutually exclusive) properties are required in transfer media intended for the separate imaging applications. For printing plates, the emphasis is typically on the durability of the transferred image and its ability to print many thousands of impressions without suffering undue wear. Hence, there is a tendency to use thicker transfer layers comprising tough, abrasion resistant resins, frequently hardenable by a post-transfer heat or UV treatment, but rarely containing dyes or pigments other than that required for absorption of the laser radiation (which is frequently a black-body absorber, such as, carbon black). In contrast, the important criteria for proofing media have been seen as the sensitivity of the imaging process, and the resolution and color fidelity of the transferred image, leading to the use of thin layers with a high pigment content, and the use of infrared-absorbing species that impart no visible coloration to the transferred image.

While these disparate approaches have been successful in optimising the performance of proofing and plate-forming media, judging each with respect to its own particular criteria, they make the correspondence between the proof and the plates (and ultimately the printed image) less accurate. Ideally, a given set of image signals, controlling a given laser imaging device, should produce the same results in both the proof and the plate, particularly with respect to parameters, such as, dot size, dot shape etc. Furthermore, any alteration to those signals (in pursuit, say, of a different color balance) should produce identical changes in both proof and plate. When transfer media with widely differing physico-chemical properties are used for the respective imaging applications, these goals become increasingly difficult to meet.

SUMMARY OF THE INVENTION

The present invention provides a method of image reproduction comprising the steps of:

(a) generating separate digital data sets representative of color separation images for a multicolor image;

(b) providing a first laser thermal transfer donor element comprising a support having coated thereon one or more layers comprising an infrared absorber and a dispersion of a colorant in an oleophilic resin, the colorant matching the color of one of the color separation images;

(c) assembling the first donor element in contact with a first receptor;

(d) scanning the first donor element with a laser having an output modulated in accordance with the digital data set representative of the separation image whose color matches the colorant used in step (b);

(e) transferring the one or more layers of the first donor element in areas struck by the laser to form an image on the first receptor;

(f) providing a second laser thermal transfer donor element identical to the first laser thermal transfer donor;

(g) assembling the second donor element in contact with a second receptor having a hydrophilic surface suitable for use in lithographic printing;

(h) scanning the second donor element with the laser modulated in accordance with the same digital data set as used in step (d);

(i) transferring the one or more layers in areas struck by the laser to form an image on the second receptor; and (j) repeating steps (b) through (i) at least once, wherein a different colorant is used on each repetition of step (b), the first receptor is used on each repetition of step (c), and a different hydrophilic receptor is used on each repetition of step (g).

The order in which the various steps are carried out may be varied. In particular, it is preferable to carry out all the repetitions of steps (b) through (e) before any of the iterations of steps (f) through (i) are carried out.

In another embodiment of the present invention, a method is provided for outputting an electronically-stored color image as both a color proof and a set of printing plates via laser thermal colorant transfer, wherein identical colorant transfer donor media are used for the production of both the proof and the plates.

The invention enables the generation of well-matched proofs and plates by direct digital address since identical transfer media are used in the respective imaging processes. A further advantage afforded by the invention is the fact that each plate bears a resin image of a color that matches the color of the ink that will be used with that plate. In other words, the identity of each plate (i.e. whether it bears the y, m, c or k separation image) is immediately apparent by visual inspection, thus removing any risk of confusion and any need to provide individual plates with identification marks.

DETAILED DESCRIPTION

Laser thermal transfer donor elements suitable for use in the present invention comprise a support bearing a coating (in one or more layers) of a transfer medium comprising an oleophilic resin, a colorant and an infrared absorber, and these ingredients must be selected to be compatible with both printing and proofing applications. The oleophilic resin may be regarded as the primary imaging component for the purposes of printing plate formation, and must provide a durable, ink-accepting image when transferred to a hydrophilic surface such as anodised aluminium. For the purposes of color proofing, the oleophilic resin acts as a binder for the dyes and/or pigments providing the necessary color, and hence should have good dispersing and film-forming properties and should have physico-chemical properties consistent with the formation of tack-free coatings, resistant to damage in the form of flaking, peeling or abrasion in the course of normal handling and storage. Solubility in common organic coating solvents, such as lower alcohols, ketones, ethers, hydrocarbons is also highly desirable.

Within these constraints, a wide variety of polymers may be suitable (including blends of two or more different polymers, or mixtures of polymers and oligomers), but in order for the printing plates to have a realistic run length, it is highly desirable that the oleophilic resin should be capable of undergoing crosslinking subsequent to transfer to the receptor. A wide variety of materials have been shown to behave in this manner, under the action of heat or UV radiation, as described, for example, in U.S. Pat. No. 5,395, 729 and any of those materials may be suitable for use in the present invention.

A particularly preferred crosslinking resin system is described in co-pending U.S. patent application Ser. No. 08/842,151 titled "Laser Induced Film Transfer System," incorporated herein by reference, and comprises a resin having a plurality of hydroxyl groups in reactive association with a latent curing agent of formula:

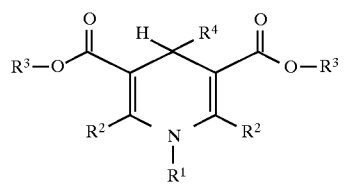

wherein $R^1$ represents H, an alkyl group, a cycloalkyl group or an aryl group; each $R^2$ independently represents an alkyl group or an aryl group; each $R^3$ independently represents an alkyl group or an aryl group; and $R^4$ represents an aryl group. $R^1$ preferably is any group compatible with formation of a stable pyridinium cation, which includes essentially any alkyl, cycloalkyl or aryl group, but for reasons of cost and convenience, simple alkyl groups (such as methyl, ethyl, propyl etc) or simple aryl groups (such as phenyl, tolyl, etc.) are preferred.

Similarly, $R^2$ may represent essentially any alkyl or aryl group, but lower alkyl groups (such as methyl, ethyl, etc.) are preferred for reasons of cost and ease of synthesis.

$R^3$ may also represent any alkyl or aryl group, but is preferably selected so that the corresponding alcohol or phenol, $R^3$—OH, is a good leaving group, as this promotes the transesterification reaction believed to be central to the curing mechanism. Thus, aryl groups comprising one or more electron-attracting substituents such as nitro, cyano, or fluorinated substituents, or alkyl groups of up to 10 carbon atoms are preferred. Most preferably, each $R^3$ represents an alkyl group such as methyl, ethyl, propyl, etc., such that $R^3$—OH is volatile at temperatures of about 10° C. and above.

$R^4$ may represent any aryl group such as phenyl, naphthyl, etc., including substituted derivatives thereof, but is most conveniently phenyl.

Analogous compounds in which $R^4$ represents H or an alkyl group are not suitable for use in the invention, because such compounds react at ambient or moderately elevated temperatures with many of the infrared dyes suitable for use in the invention and hence the relevant compositions have a limited shelf life.

Preferred compounds of formula (I) suitable for use in the invention include the following:

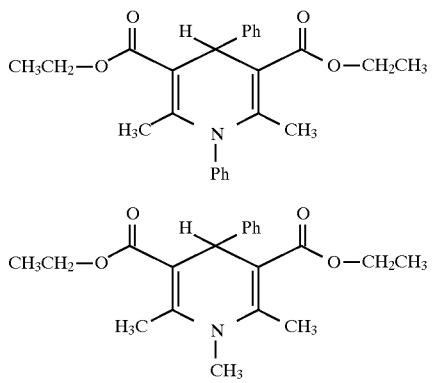

The relevant compounds may be prepared by known methods, e.g. by an adaptation of the Hantsch pyridine synthesis.

The resin having a plurality of hydroxy groups, may be selected from a wide variety of materials. Prior to laser address, the media ideally should be in the form of a smooth, tack-free coating, with sufficient cohesive strength and durability to resist damage by abrasion, peeling, flaking, dusting, etc. in the course of normal handling and storage. If the hydroxy-functional resin is the sole or major resin component (which is the preferred situation), then its physical and chemical properties should be compatible with the above requirements. Thus, film-forming polymers with glass transition temperatures higher than ambient temperature are preferred. Preferably, the polymers are capable of dissolving or dispersing the other components of the transfer media, and themselves are soluble in the typical coating solvents such as lower alcohols, ketones, ethers, hydrocarbons, haloalkanes and the like. Since the transfer media are intended for printing plate applications, the resin preferably has oleophilic rather than hydrophilic properties.

The hydroxy groups may be alcohol groups or phenol groups (or both), but alcohol groups are preferred. The requisite hydroxy groups may be incorporated in a polymeric resin by polymerisation or copolymerisation of hydroxy-fInctional monomers such as allyl alcohol and hydroxyalkyl acrylates or methacrylates, or by chemical conversion of preformed polymers, e.g. by hydrolysis of polymers and copolymers of vinyl esters such as vinyl acetate. Polymers with a high degree of hydroxyl functionality, such as poly(vinyl alcohol), cellulose, etc., are in principle suitable for use in the invention, but in practice their solubility and other physico-chemical properties are less than ideal for most applications. Derivatives of such polymers, obtained by esterification, etherification or acetalisation of the bulk of the hydroxy groups, generally exhibit superior solubility and film-forming properties, and provided that at least a minor proportion of the hydroxy groups remain unreacted, they are suitable for use in the invention. A preferred hydroxy-functional resin for use in the invention belongs to this class and is the product formed by reacting poly(vinyl alcohol) with butyraldehyde. Commercial grades of this material (supplied by Monsanto under the tradename BUTVAR) typically leave at least 5% of the hydroxyl groups unreacted and combine solubility in common organic solvents with excellent film-forming and pigment-dispersing properties.

Alternatively, a blend of "inert" and hydroxy-functional resins may be used, in which the inert resin provides the requisite film-forming properties which may enable the use of lower molecular weight polyols, but this is not preferred.

Another component of the transfer media is a colorant in the form of one or more dyes or pigments. Essentially any dye or pigment or mixture of dyes and/or pigments of the desired hue may be used as a colorant in the transfer media, but pigments in the form of dispersions of solid particles are particularly preferred. Solid-particle pigments typically have a much greater resistance to bleaching or fading on prolonged exposure to sunlight, heat, humidity, etc. in comparison to soluble dyes, and hence can be used to form durable images, suitable for use outdoors or in other demanding environments. The use of pigment dispersions in color proofing materials is well known in the art, and any of the pigments previously used for that purpose may be used in the present invention. Pigments or blends of pigments matching the yellow, magenta, cyan and black references provided by the International Prepress Proofing Association (known as the SWOP color references) are particularly preferred, although the invention is not limited to those colors. Pigments of essentially any color may be used, including so-called "exotic" colors and those conferring special effects, such as, opalescence or fluorescence.

In preferred embodiments of the invention, the transfer media comprise a fluorochemical additive in addition to a dispersion of pigment particles, as disclosed in European Publication No. 0602893. The use of such an additive in an amount corresponding to at least one part by weight per 20 parts by weight of pigment, preferably at least one part per 10 parts by weight of pigment, provides much improved resolution and sensitivity in the laser thermal transfer process. Preferred fluorochemical additives comprise a perfluoroalkyl chain of at least six carbon atoms attached to a polar group, such as, carboxylic acid, ester, sulphonamide, etc.

Another component of the transfer media is an infrared absorber. While in principle any infrared absorbing dye or pigment may be used, provided it is capable of absorbing the output of the laser source and generating heat as a result; in practice it is perfered for accurate color proofing purposes that the IR absorber not contaminate the transferred image. This may be achieved by minimizing the extent to which the IR absorber co-transfers with the resin and colorant (e.g. by coating it in an underlayer to the layer comprising the resin and colorant), by selecting a dye with minimal visible coloration, or by providing means for bleaching the contaminating absorption during or subsequent to the transfer process, or by a combination of these techniques. In practice, it is difficult to completely eliminate co-transfer of the IR absorber, or to find dyes with no visible coloration, and so bleachable IR dyes are preferred. Bleaching of photothermal converting dyes in laser thermal transfer imaging is disclosed in EP 0675003, in co-pending U.S. patent application Ser. No. 08/842,151 titled "Laser Induced Film Transfer System," incorporated herein by reference, and in co-pending U.S. patent application Ser. No. 08/841,420 titled "Thermal Bleaching of Infrared Dyes" incorporated herein by reference. For use with the preferred crosslinkable binder system, the infrared absorber is preferably a cationic dye in which the infrared-absorbing chromophore bears a delocalized positive charge, which is balanced by a negatively-charged counterion, such as, perchlorate, tetrafluoroborate, hexafluorophosphate and the like. It is believed that dyes of this type can facilitate the oxidation of compounds of formula (I) to the corresponding pyridinium salts when photo-excited by laser irradiation. Suitable cationic infrared dyes include the class of amine cation radical dyes (also known as immonium dyes) disclosed, for example, in WO90/12342, JP51-088016 and (in greater detail) in European Patent Application No. 963027994.1. Included in this class are the diamine dication radical dyes (in which the chromophore bears a double positive charge), exemplified by materials, such as, Cyasorb™ IR165, which is commercially available from Glendale Protective Technologies Inc. Dyes of this class typically absorb over a broad range of wavelengths in the near infrared, making them suitable for address by YAG lasers as well as diode lasers.

Preferred infrared dyes for use in the invention belong to the class of cationic dyes known as the tetraarylpolymethine (TAPM) dyes. Such dyes comprise a polymethine chain having an odd number of carbon atoms (5 or more), each terminal carbon atom of the chain being linked to two aryl substituents. The preferred dyes of this class have a nucleus of formula (II):

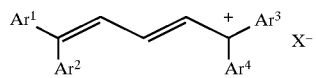

where $Ar^1$–$Ar^4$ are aryl groups which may be the same or different such that at least one of the aryl groups represented by $Ar^1$–$Ar^4$ bears a tertiary amino substituent (preferably in the 4-position), and X is an anion. Preferably no more than two of the aryl groups bear a tertiary amino substituent, and the aryl groups bearing the tertiary amino substituents are preferably attached to different ends of the polymethine chain. Examples of tertiary amino groups include dialkylamino groups (such as dimethylamino, diethylamino, etc.), diarylamino groups (such as diphenylamino), alkylarylamino groups (such as N-methylanilino), and heterocyclic groups such as pyrrolidino, morpholino or piperidino. The tertiary amino group may form part of a fused ring system, e.g. one or more of $Ar^1$–$Ar^4$ may represent a julolidine group.

The aryl groups represented by $Ar^1$–$Ar^4$ may comprise phenyl, naphthyl, or other fused ring systems, but phenyl rings are preferred. In addition to the tertiary amino groups discussed previously, substituents which may be present on the rings include alkyl groups (preferably of up to 10 carbon atoms), halogen atoms (such as Cl, Br, etc.), hydroxy groups, thioether groups and alkoxy groups. Substituents which donate electron density to the conjugated system, such as alkoxy groups, are particularly preferred.

Substituents, especially alkyl groups of up to 10 carbon atoms or aryl groups of up to 10 ring atoms, may also be present on the polymethine chain.

Preferably the anion X is derived from a strong acid (e.g. HX should have a pKa of less than 3, preferably less than 1).

Suitable identities for X include $ClO_4$, $BF_4$, $CF_3SO_3$, $PF_6$, $AsF_6$, $SbF_6$ and perfluoroethylcyclohexylsulphonate.

Preferred dyes of this class include:

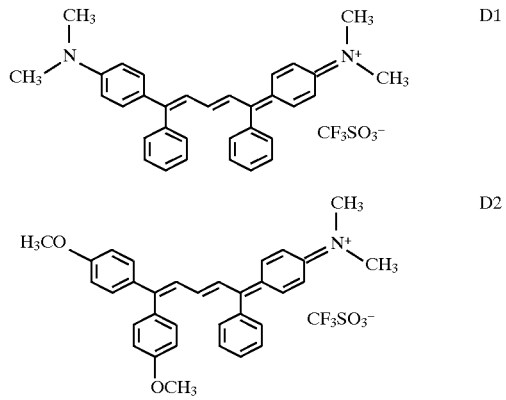

The relevant dyes may be synthesised by known methods, e.g. by conversion of the appropriate benzophenones to the corresponding 1,1-diarylethylenes (by the Wittig reaction, for example), followed by reaction with a trialkyl orthoester in the presence of strong acid HX.

The dyes of formula (II) generally absorb in the 700 to 900 nm region, making them suitable for diode laser address: see e.g., JP63-319191; JP63-319192; U.S. Pat. No. 4,950,639; EP 0602893; and EP 0675003 which disclose their use as absorbers in laser addressed thermal transfer media of different types.

Minor amounts of other ingredients may optionally be present in the transfer media, such as surfactants, coating aids, pigment dispersing aids, etc., in accordance with known techniques.

The transfer media are formed as a coating on a support. The support may be any sheet-form material of suitable thermal and dimensional stability, and for most applications should be transparent to the exposing laser radiation. Polyester film base, of about 20 to 200 μm thickness, is particularly useful, and if necessary may be surface-treated so as to modify its wettability and adhesion to subsequently-applied coatings. Such surface treatments include corona discharge treatment and the application of subbing layers or release layers, including dynamic release layers such as those disclosed in U.S. Pat. No. 5,171,650.

The transfer medium may be coated as a single layer, or as two or more contiguous layers. For example, the infrared dye may be coated as an underlayer with the remaining ingredients coated on top. Preferably the transfer medium comprising all the necessary components is coated in a single layer.

The relative proportions of the components of the transfer medium may vary widely, depending on the particular choice of ingredients. Generally, the infrared dye is present in sufficient quantity to provide a transmission optical density of at least 0.5, preferably at least 1.0, at the exposing wavelength, and the colorant provides a reflection optical density of at least 0.5, preferably at least 1.0, at the relevant viewing wavelength(s).

Preferred pigmented transfer media have the following approximate composition (all percentages are by weight):

| | |
|---|---|
| hydroxy-functional film-forming resin (e.g. Butvar ™ B76) | 25 to 75% |
| latent curing agent | 10 to 40% |

-continued

| | |
|---|---|
| (e.g. C1 or C2) infrared dye (e.g. D1 or D2) | 5 to 25% |
| pigment | 10 to 40% |
| fluorochemical additive (e.g. a perfluoroalkylsulphonamide) | 1.5 to 15% |

Thin coatings (e.g. less than about 3 μm dry thickness) of the above formulation may be transferred to a variety of receptor sheets by laser irradiation. Transfer occurs with high sensitivity and resolution, and heating the transferred image for relatively short periods (e.g. one minute or more) at temperatures in excess of about 120° C. causes curing and hardening, and hence an image of enhanced durability.

The transfer media are readily prepared by dissolving or dispersing the various components in a suitable organic solvent and coating the mixture on film base. Pigmented transfer media are most conveniently prepared by predispersing the pigment in the hydroxy-functional resin in roughly equal proportions by weight, in accordance with standard procedures used in the color proofing industry, thereby providing pigment "chips". Dispersing the chips in a solvent provides a millbase, to which further resin, solvents, etc. are added as required to give the final coating formulation. Any of the standard coating methods may be employed, such as roller coating, knife coating, gravure coating, bar coating etc., followed by drying at moderately elevated temperatures.

A wide variety of receptor sheets may be used in the practice of the invention. For the formation of printing plates, the receptor may be any of the commonly-used printing plate supports, and is typically an aluminium foil that has been subjected to one or more of the conventional treatments (graining, anodising, etching, etc.) to provide a durable, hydrophilic surface. For color proofing purposes, the receptor is preferably paper (plain or coated) or a plastic film coated with a thermoplastic receiving layer, and may be transparent or opaque. Non-transparent receptor sheets may be diffusely-reflecting or specularly-reflecting.

When the receptor sheet comprises a paper or plastic sheet coated with a thermoplastic receiving layer, the receiving layer is typically several microns thick, and may comprise any thermoplastic resin capable of providing a tack-free surface at ambient temperatures, and which is compatible with the transferred colorant. Preferably, the receiving layer comprises the same resin(s) as used as the binder(s) of the colorant transfer layer. When a receiving layer is present, it may advantageously contain a bleaching agent for the infrared dye, as disclosed in EP 0675003 and in co-pending U.S. patent application Ser. No. 08/841,420 titled "Thermal Bleaching of Infrared Dyes" incorporated herein by reference.

The receptor sheet used for color proofing may be textured or otherwise engineered so as to present a surface having a controlled degree of roughness, e.g. by incorporating polymer beads, silica particles, etc. in the receiving layer (see e.g., U.S. Pat. No. 4,876,235). Alternatively, roughening agents may be incorporated in the transfer medium, as disclosed in EP 0163297, EP 0679531 and EP 0679532. When one (or both) of the donor and receptor sheets presents a roughened surface, vacuum draw-down of the one to the other is facilitated. It is highly desirable that the receptor used in the formation of the color proof should exhibit a degree of surface roughness that is similar to that shown by the hydrophilic receptor used in the plate-forming process. This provides further improvements in the matching of proof to plates by ensuring that the conditions under which the respective transfer processes occur are, as far as possible, identical.

The procedure for imagewise transfer of colorant from donor to receptor is conventional. The two elements are assembled in intimate face-to-face contact, e.g. by vacuum hold down or alternatively by means of the cylindrical lens apparatus described in U.S. Pat. No. 5,475,418 and scanned by a suitable laser. The assembly may be imaged by any of the commonly used lasers, depending on the absorber used, near infrared emitting lasers, such as, diode lasers and YAG lasers, is preferred. Any of the known scanning devices may be used, e.g. flat-bed scanners, external drum scanners or internal drum scanners. In these devices, the assembly to be imaged is secured to the drum or bed, e.g., by vacuum hold-down, and the laser beam is focused to a spot, e.g., of about 20 microns diameter, on the IR-absorbing layer of the donor-receptor assembly. This spot is scanned over the entire area to be imaged while the laser output is modulated in accordance with electronically stored image information. Two or more lasers may scan different areas of the donor receptor assembly simultaneously, and if necessary, the output of two or more lasers may be combined optically into a single spot of higher intensity. Laser address is normally from the donor side, but may be from the receptor side if the receptor is transparent to the laser radiation.

Although any form of laser-mediated mass transfer may be suitable for the practice of the invention, curing and hardening of the transferred image is most effective when each pixel of the image remains substantially intact and coherent during the transfer from the donor to the receptor. Thus melt-stick transfer, in which the pixels are transferred in a molten or semi-molten state, is preferable to ablation transfer, which involves an explosive decomposition and/or vaporization of the imaging medium, and hence results in fragmentation of the transferred pixels. Factors which favor the melt-stick mechanism include the use of less-powerful lasers (or shorter scan times for a given laser output) and the absence from the imaging medium of binders which are self-oxidising or otherwise thermally-degradable, such as those disclosed in WO 90/12342.

Where appropriate, after peeling the donor sheet from the receptor, the image residing on the receptor is cured by subjecting it to a suitable treatment, such as UV irradiation or heat treatment, e.g. at temperatures in excess of about 120° C. This may be carried out by a variety of means, such as storage in an oven, hot air treatment, contact with a heated platen or passage through a heated roller device. For the purposes of color proofing, curing the transferred image is not strictly necessary, but may be desirable in the interests of a more durable image. In such a situation, it is more convenient to delay the curing step until all the separate colorant transfer steps have been completed, then provide a single heat treatment for the composite image. However, if the individual transferred images are particularly soft or easily damaged in their uncured state, then it may be necessary to cure and harden each monochrome image prior to transfer of the next, but in preferred embodiments of the invention, this is not necessary.

In some situations, the receptor on which a multicolor image is initially assembled is not the final substrate on which the image is viewed. For example, U.S. Pat. No. 5,126,760 discloses thermal transfer of a multicolor image to a first receptor, with subsequent transfer of the composite image to a second receptor for viewing purposes, and a similar technique may be used in the present invention.

The invention will be further illustrated by the following Examples in which the abbreviations, tradenames, etc. are represented by the following:

Butvar™ B-76 polyvinylbutyral resin available from Monsanto, with free OH content of 7–13 mole %.

Latent curing agent C1 has the following chemical structure:

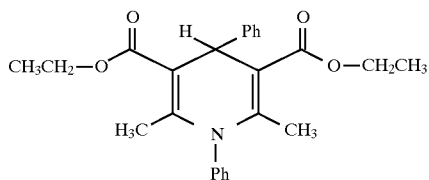

Infrared dye D1 has the following chemical structure:

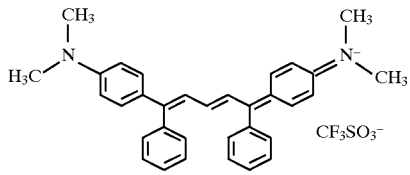

Disperbyk™ 161 is a dispersing agent available from BYK-Chemie.

MEK is methyl ethyl ketone (butan-2-one).

PET is a polyethyleneterephthalate film.

FC is N-methylperfluorooctylsulphonamide.

EXAMPLE 1

In the following formulations, all parts are by weight.

Donor Sheets

Separate cyan, yellow, magenta and black millbases were prepared by milling the appropriate pigment (360 parts) with Butvar B-76 (240 parts) in the presence of Disperbyk 161 (101 parts) and 1-methoxypropan-2-ol (100 parts) on a two-roll mill. The "chips" produced were dispersed in a 1:1 mixture (by weight) of MEK and 1-methoxypropan-2-ol to provide millbases comprising 15% solids (by weight). Coating formulations were prepared by mixing millbase, Butvar B-76 resin solution, MEK, infrared dye, curing agent and ethanol (in that order) in the quantities shown below, stirring until the dye had dissolved, then adding the FC.

|  | Cyan | Yellow | Magenta | Black |
|---|---|---|---|---|
| Millbase | 497 | 423 | 692 | 577* |
| Butvar ™ B-76 (15 wt % in MEK) | 684 | 278 | 377 | 492 |
| Infrared dye D1 | 30 | 30 | 20 | 15 |
| Curing agent C1 | 38.5 | 38.5 | 34 | 34 |
| MEK | 1335 | 1020 | 1158 | 1155 |
| Ethanol | 268 | 193 | 220 | 220 |
| FC | 10 | 7.7 | 9 | 9 |

*473 parts black mixed with 29 parts magenta + 75 parts cyan millbases.

Colorant donor sheets were prepared by bar coating the separate formulations on 50 μm PET base to provide a thickness of about 1 μm after drying at 93° C.

Color Proof

A paper receptor sheet (bearing a colorless coating of Butvar™ B-76 resin) was mounted on an external drum laser scanning device, and a sample of the cyan donor was secured in face-to-face contact with it, using adhesive tape. The assembly was exposed to laser diode radiation (580 mW at 870 nm, focused to a 30 μm spot) at a scan rate of 200 cm/sec, the laser output being modulated in accordance with cyan negative color separation data. After this exposure was complete, the cyan donor was removed and replaced by the magenta donor, and the imaging process repeated, with modulation in accordance with magenta negative color separation data. Thereafter, yellow and black separation images were transferred to the same receptor in register by the identical technique. The composite image was finally exposed to UV radiation (sunlight) to bleach residual staining from the infrared dye. The result was a full color image of high quality, with the full tonal range of 1–99% dots (150 line screen) reproduced accurately.

Printing Plates

An unexposed Viking™ plate (commercially available from Imation Corp.) was washed in its normal developer solution to remove the photosensitive coating, dried, then mounted on the drum of the same scanning laser exposure device as used above. A further sample of the cyan donor sheet described above was taped in face-to-face contact with the aluminium receptor and the assembly exposed under the same conditions as before, using the same cyan color separation data. The process was repeated using the magenta, yellow and black donors and a fresh plate support in each case. The result was a set of plates bearing the appropriate separation images which were an excellent match of the corresponding images on the proof.

To assess the potential run length of the plates, one of them (the magenta) was baked at 160° C. for 3 minutes, then tested on a Praktika™ 00 press using Vanson™ 40904 ink, Imation Viking™ fountain solution and Royal Print™ 700 Glosscoat paper. It rolled up cleanly and easily, and showed no signs of wear after 3000 impressions, when the test was terminated.

What is claimed:

1. A method of image reproduction comprising the steps of:

(a) generating separate digital data sets representative of color separation images for a multicolor image;

(b) providing a first laser thermal transfer donor element comprising a support having coated thereon one or more layers comprising an infrared absorber and a dispersion of a colorant in an oleophilic resin, said colorant matching the color of one of said color separation images;

(c) assembling said first donor element in contact with a first receptor;

(d) scanning said first donor element with a laser having an output modulated in accordance with the digital data set representative of the separation image whose color matches the colorant used in step (b);

(e) transferring said one or more layers of said first donor element in areas struck by said laser to form an image on said first receptor;

(f) providing a second laser thermal transfer donor element identical to said first laser thermal transfer donor;

(g) assembling said second donor element in contact with a second receptor having a hydrophilic surface suitable for use in lithographic printing;

(h) scanning said second donor element with said laser modulated in accordance with the same digital data set as used in step (d);

(i) transferring said one or more layers in areas struck by said laser to form an image on said second receptor; and (j) repeating steps (b) through (i) at least once, wherein a different colorant is used on each repetition of step (b), the first receptor is used on each repetition of step (c), and a different hydrophilic receptor is used on each repetition of step (g).

2. The method of claim 1 wherein all the repetitions of steps (b) and (e) are conducted before any of steps (f) and (i) are conducted.

3. The method of claim 1 wherein said oleophilic resin comprises a plurality of hydroxyl groups.

4. The method of claim 3 wherein said oleophilic resin is a reaction product of poly(vinyl alcohol) with butyraldehyde.

5. The method of claim 3 wherein said first and second transfer elements comprise a latent curing agent having the following formula:

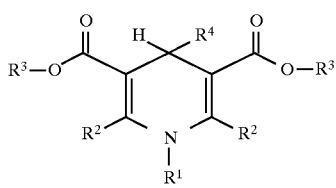

wherein
$R^1$ is selected from the group consisting of a H, an alkyl group, a cycloalkyl group and an aryl group;
each $R^2$ independently is an alkyl group or an aryl group;
each $R^3$ independently is an alkyl group or an aryl group; and
$R^4$ is an aryl group.

6. The method of claim 5 wherein $R^1$, $R^2$ and $R^3$ independently are an alkyl group of 1 to 5 carbon atoms and $R^4$ is an optionally substituted phenyl group.

7. The method of claim 5 wherein said curing agent is selected from the group consisting of

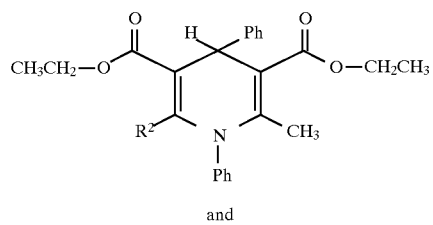

and

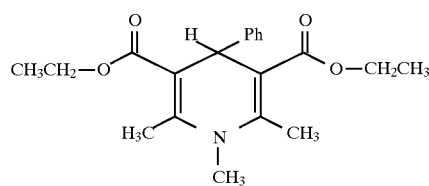

8. The method of claim 1 wherein said infrared absorber has a nucleus having the formula:

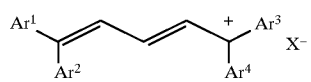

wherein:
$Ar^1$, $Ar^2$, $Ar^3$ and $Ar^4$ are aryl groups which may be the same or different such that at least one of said aryl groups bears at least one tertiary amino substituent and
X is an anion.

9. The method of claim 8 wherein $Ar^1$ or $Ar^2$ and $Ar^3$ or $Ar^4$ bear at least one tertiary amino substituent.

10. The method of claim 8 wherein said infrared absorber is selected from the group consisting of

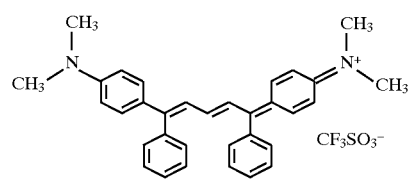

and

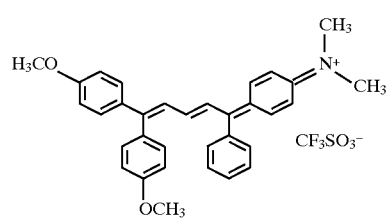

11. The method of claim 1 wherein said first and second transfer elements additionally comprise a fluorochemical additive comprising a perfluoroalkyl chain of at least 6 carbon atoms attached to a polar group.

12. The method of claim 1 wherein said first receptor comprises plain paper, coated paper, or plastic film coated with a thermoplastic receiving layer.

13. The method of claim 1 wherein said second receptor comprises a printing plate support.

14. The method of claim 13 wherein said second receptor comprises aluminium foil which has been treated by graining, anodising or etching to provide a durable hydrophilic surface.

15. The method of claim 1 wherein the image residing on said first or second receptor is cured by UV irradiation or heat treatment.

16. The method of claim 1 further comprising the step of using said second receptor after step (i) as a lithographic printing plate.

* * * * *